(12) United States Patent
Soma

(10) Patent No.: US 11,311,956 B2
(45) Date of Patent: Apr. 26, 2022

(54) SOLDERING APPARATUS

(71) Applicant: SENJU METAL INDUSTRY CO., LTD., Tokyo (JP)

(72) Inventor: Kazunari Soma, Tokyo (JP)

(73) Assignee: SENJU METAL INDUSTRY CO., LTD., Tokyo (JP)

(*) Notice: Subject to any disclaimer, the term of this patent is extended or adjusted under 35 U.S.C. 154(b) by 0 days.

(21) Appl. No.: 17/409,405

(22) Filed: Aug. 23, 2021

(65) Prior Publication Data
US 2022/0072641 A1 Mar. 10, 2022

(30) Foreign Application Priority Data
Sep. 8, 2020 (JP) .............................. JP2020-150298

(51) Int. Cl.
*B23K 3/04* (2006.01)
*H05K 3/00* (2006.01)
(Continued)

(52) U.S. Cl.
CPC ............ *B23K 1/0016* (2013.01); *B23K 1/008* (2013.01); *B23K 1/012* (2013.01); *B23K 3/04* (2013.01);
(Continued)

(58) Field of Classification Search
CPC ..................................... B23K 3/04; H05K 3/34
See application file for complete search history.

(56) References Cited

U.S. PATENT DOCUMENTS 4,909,430 A * 3/1990 Yokota .................. B23K 1/008
219/388
5,345,061 A * 9/1994 Chanasyk ............. B23K 1/008
219/400
(Continued)

FOREIGN PATENT DOCUMENTS

JP 2001-144426 A 5/2001
JP 2006-153440 A 6/2006
(Continued)

OTHER PUBLICATIONS

Office Action dated Nov. 4, 2020 in Japanese Patent Application No. 2020-150298, with English translation.
(Continued)

*Primary Examiner* — Devang R Patel
(74) *Attorney, Agent, or Firm* — Harness, Dickey & Pierce, P.L.C.

(57) ABSTRACT

Provided is a soldering apparatus capable of blowing gas through a first blowing port more uniformly than a conventional apparatus, at each position in the first blowing port. The soldering apparatus according to the present disclosure is a soldering apparatus that performs soldering, including a blowing unit that supplies gas to an object, wherein the blowing unit includes a case including a first blowing chamber, a fan housed in the first blowing chamber to blow the gas in a centrifugal direction, a first baffle plate, and a heater that heats the gas or a cooling unit that cools the gas, the case includes a first wall that faces the fan in an axial direction of the fan, a second wall that faces the first wall, and an inner wall connecting the first wall and the second wall, the first wall, the second wall and the inner wall define the first blowing chamber, in the first wall, a first blowing port is formed, and the first baffle plate is disposed in the first
(Continued)

blowing chamber to guide part of the gas blown from the fan to the first blowing port.

11 Claims, 5 Drawing Sheets

(51) Int. Cl.
    *B23K 1/00*         (2006.01)
    *B23K 1/008*       (2006.01)
    *B23K 1/012*       (2006.01)
    *H05K 3/34*        (2006.01)
    *B23K 101/42*     (2006.01)

(52) U.S. Cl.
    CPC ........ *H05K 3/3494* (2013.01); *B23K 2101/42* (2018.08); *H05K 2203/081* (2013.01)

(56) References Cited

U.S. PATENT DOCUMENTS

| | | | |
|---|---|---|---|
| 5,405,074 A * | 4/1995 | Den Dopper | B23K 1/008 228/42 |
| 5,567,151 A * | 10/1996 | Mizoguchi | B23K 1/008 432/59 |
| 5,913,589 A * | 6/1999 | Dow | B23K 3/082 34/379 |
| 6,123,250 A * | 9/2000 | De Klein | B23K 1/012 228/180.1 |
| 6,135,344 A * | 10/2000 | Sakuyama | F27B 9/243 228/234.1 |
| 6,412,681 B2 * | 7/2002 | Mukuno | B23K 1/012 228/46 |
| 9,144,158 B2 * | 9/2015 | Yokota | H05K 3/3494 |
| 9,485,872 B2 * | 11/2016 | Hiyama | B23K 3/04 |
| 2012/0178039 A1 * | 7/2012 | Kagaya | B23K 3/08 432/219 |

FOREIGN PATENT DOCUMENTS

| | | |
|---|---|---|
| JP | 2013-27931 A | 2/2013 |
| JP | 6854436 B1 | 4/2021 |

OTHER PUBLICATIONS

Decision to Grant a Patent dated Feb. 12, 2021 in Japanese Patent Application No. 2020-150298, with English translation.

\* cited by examiner

SOLDERING APPARATUS

CROSS-REFERENCE TO RELATED APPLICATION

This application is based upon and claims benefit of priority from Japanese Patent Application No. 2020-150298 filed on Sep. 8, 2020, the entire contents of which are incorporated herein by reference.

TECHNICAL FIELD

The present invention relates to a soldering apparatus.

BACKGROUND ART

In a case of soldering an electronic component to a circuit board, a soldering apparatus such as a reflowing apparatus or a jet soldering apparatus is used. For example, in PTL 1, disclosed is a reflowing apparatus including, as shown in FIG. 5, a blower, a baffle plate that receives and disperses wind jetted downward from the blower, a heater disposed below the baffle plate, and a panel disposed below the heater and including a large number of small holes formed therein. This blower includes a case, a motor, and a blade housed in the case and rotated by the motor. Then, this case includes an inner surface extending in a rotary shaft direction, and a vertical surface extending in a direction vertical to the inner surface, and a hole is formed in the vertical surface. Consequently, when the blade rotates in the blower, wind caused by the rotation of the blade hits the inner surface of the case, has a flowing direction changed by the inner surface, and is blown through the hole formed in the vertical surface to outside of the case. Afterward, this wind is dispersed by the baffle plate, passes through the heater and the large number of small holes formed in the panel, and is blown as hot air to an object to be heated.

CITATION LIST

Patent Literature

PTL 1: Japanese Patent Laid-Open No. 2013-27931

SUMMARY OF INVENTION

Technical Problem

In a blower described in PTL 1, as described above, wind that hits an inner surface of a case and having a flowing direction changed is blown through a hole to outside of the case. Consequently, a flow rate of gas passing through a portion of the hole that is far from a blade and close to the inner surface is higher than a flow rate of gas passing through a portion of the hole that is close to the blade and far from the inner surface. That is, in this blower, a difference might be made in flow rate between the gases passing through positions in the hole, depending on the positions in the hole. As a result, when the gas blown through the hole of the blower is blown as it is to a panel without being dispersed, a flow rate of hot air blown through small holes of the panel to an object to be heated might be nonuniform. Consequently, in a reflowing apparatus described in PTL 1, wind blown out from the blower is dispersed by a baffle plate, and the flow rate of the hot air blown through the small holes of the panel to the object to be heated is made uniform.

However, in a case where the flow rate of gas to be blown through the hole of the blower is excessively nonuniform depending on the position in the hole through which the gas is blown, wind cannot be sufficiently dispersed by the baffle plate, and gas might not be uniformly blown to the object to be heated. Also, in a case where the gas blown through the hole of the blower is dispersed by the baffle plate, the baffle plate attached to block the blown gas forcibly disperses wind. Consequently, pressure loss remarkably increases. Thus, it is required that gas is blown through the hole of the case at a uniform flow rate at each position in the hole.

To solve the problem, an object of the present disclosure is to provide a soldering apparatus capable of blowing gas through a hole (a first blowing port) more uniformly than a conventional apparatus, at each position in the hole (the first blowing port).

Solution to Problem

A soldering apparatus according to an embodiment is a soldering apparatus that performs soldering, including a blowing unit that supplies gas to an object, wherein the blowing unit includes a case including a first blowing chamber, a fan housed in the first blowing chamber to blow the gas in a centrifugal direction, a first baffle plate, and a heater that heats the gas or a cooling unit that cools the gas, the case includes a first wall that faces the fan in an axial direction of the fan, a second wall that faces the first wall, and an inner wall connecting the first wall and the second wall, the first wall, the second wall and the inner wall define the first blowing chamber, in the first wall, a first blowing port is formed, and the first baffle plate is disposed in the first blowing chamber to guide part of the gas blown from the fan to the first blowing port.

Advantageous Effects of Invention

A soldering apparatus according to the present disclosure is capable of blowing gas through a first blowing port more uniformly than a conventional apparatus, at each position in the first blowing port.

DESCRIPTION OF EMBODIMENTS

Figure 1:
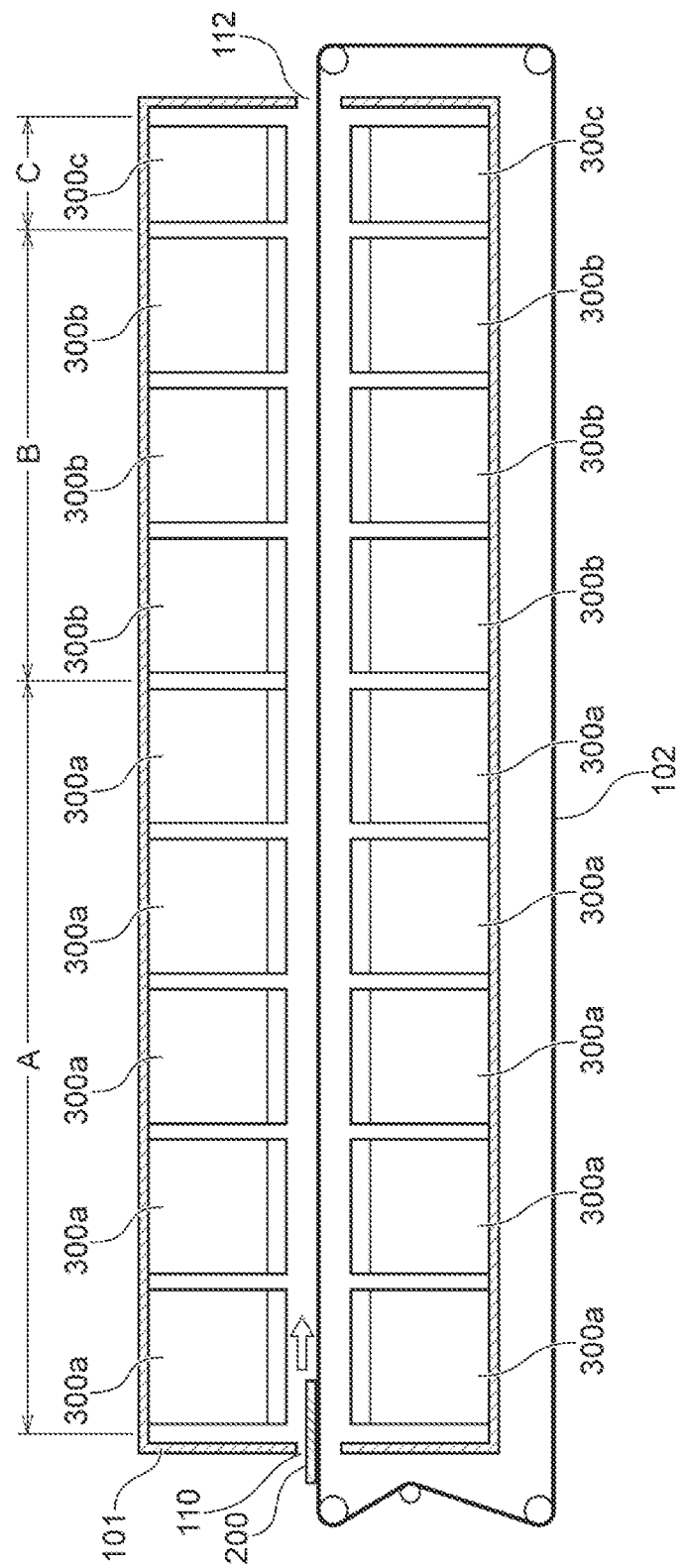
FIG. 1 is a structural view of a reflowing furnace according to a first embodiment of the present disclosure.

Hereinafter, description will be made as to embodiments of the present invention with reference to the drawings. In the drawings illustrated as follows, the same or corresponding constituent elements are denoted with the same reference sign to omit redundant description.

First Embodiment (Entire Configuration)
FIG. 1 is a sectional view of a reflowing furnace 100 according to a first embodiment of the present disclosure. Referring to FIG. 1, the reflowing furnace 100 includes a body part 101 and a conveyor 102 that conveys a circuit board 200. The reflowing furnace 100 is an apparatus for soldering an electronic component to the circuit board 200 by a reflowing system. In the reflowing furnace 100, while the circuit board 200 on which the electronic component is mounted via solder paste is conveyed from an entrance 110 to an exit 112, the electronic component is soldered to the circuit board 200. Note that the reflowing furnace 100 is an example of a soldering apparatus, and the circuit board 200 is an example of an object. Hereinafter, description will be made as to the reflowing furnace 100 in detail.

The body part 101 is divided into three zones, i.e., a preheating zone A, a main heating zone B and a cooling zone C, in the order from the entrance 110. In the preheating zone A, five blowing units 300a are arranged in each of upper and lower rows. Each of the blowing units 300a in the preheating zone A supplies the heated gas to the circuit board 200, and heats the circuit board 200 at 150 to 180 degrees as an example. Consequently, the circuit board 200 and the electronic component are preheated. That is, the preheating zone A is a region for slowly heating the circuit board 200 and the electronic component and the like mounted on the circuit board 200 to be accustomed to heat. Note that a configuration of the blowing unit 300a will be described later in detail.

In the main heating zone B, three blowing units 300b are arranged in each of the upper and lower rows. Each blowing unit 300b in the main heating zone B supplies the heated gas to the circuit board 200, and heats the circuit board 200 at 220 to 260 degrees as an example. Consequently, the blowing unit 300b melts solder contained in the solder paste, and solders the electronic component to the circuit board 200. That is, the main heating zone B is a region for melting solder powder in the solder paste to perform the soldering.

In the cooling zone C, one blowing unit 300c is disposed in each of the upper and lower rows. The blowing unit 300c blows cooled gas toward the circuit board 200, and cools the soldered circuit board 200. That is, the cooling zone C is a region for cooling the soldered circuit board 200.

Note that in another embodiment, the reflowing furnace 100 is not limited to the above described configuration, and an arbitrary known configuration may be adopted. For example, an interior of the reflowing furnace 100 according to the present embodiment is filled with nitrogen as an example, and each of the blowing units 300a, 300b and 300c can inject nitrogen toward the circuit board 200. However, in the other embodiment, the interior of the reflowing furnace 100 may be filled with any known gas for use by a person skilled in the art, and each of the blowing units 300a, 300b and 300c may inject any gas for use by the person skilled in the art. Furthermore, the reflowing furnace 100 according to the present embodiment includes one conveyor 102, but in the other embodiment, the reflowing furnace 100 may include a plurality of conveyors 102 arranged in parallel. In this case, the respective conveyors 102 may independently convey the circuit board 200.

(Blowing Unit)

Figure 2:
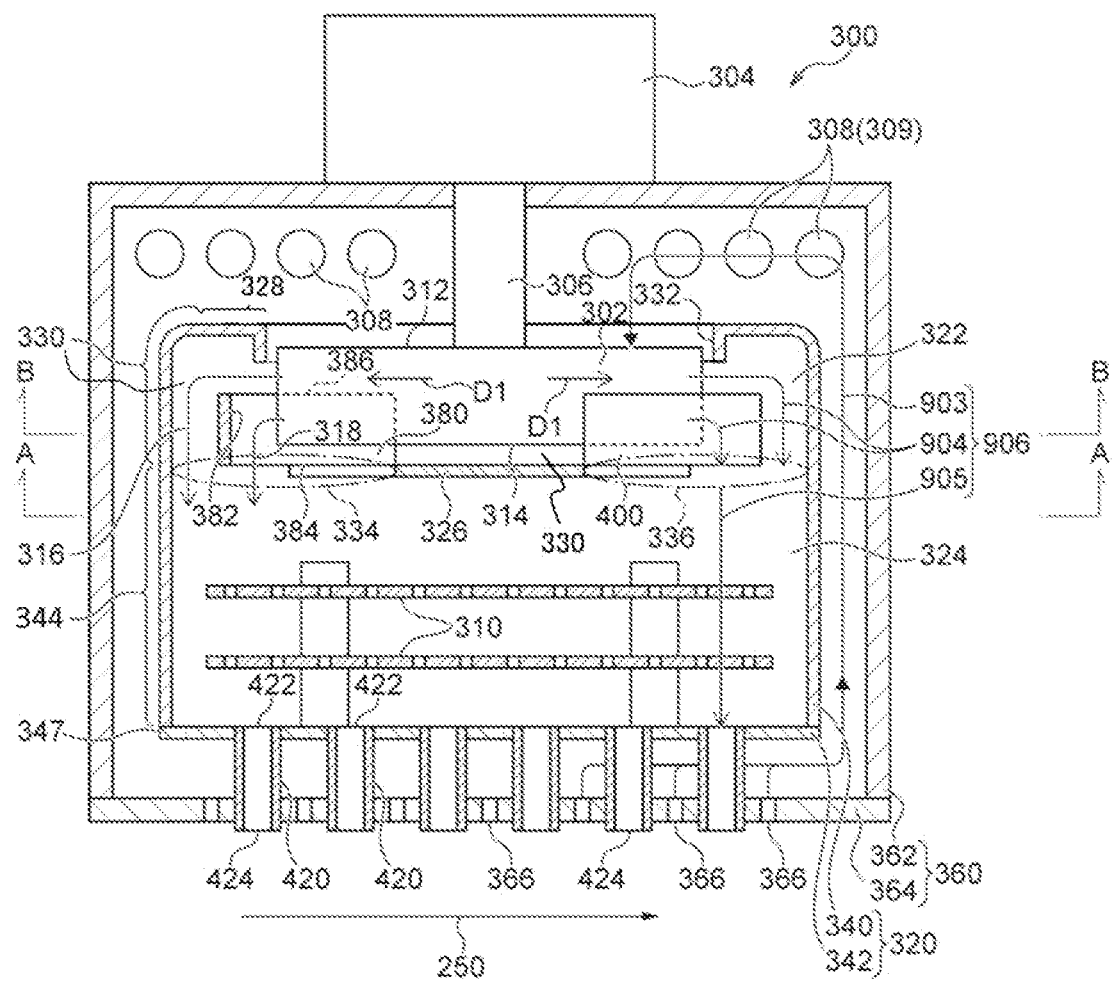
FIG. 2 is a structural view of a blowing unit shown in FIG. 1.
Figure 3:
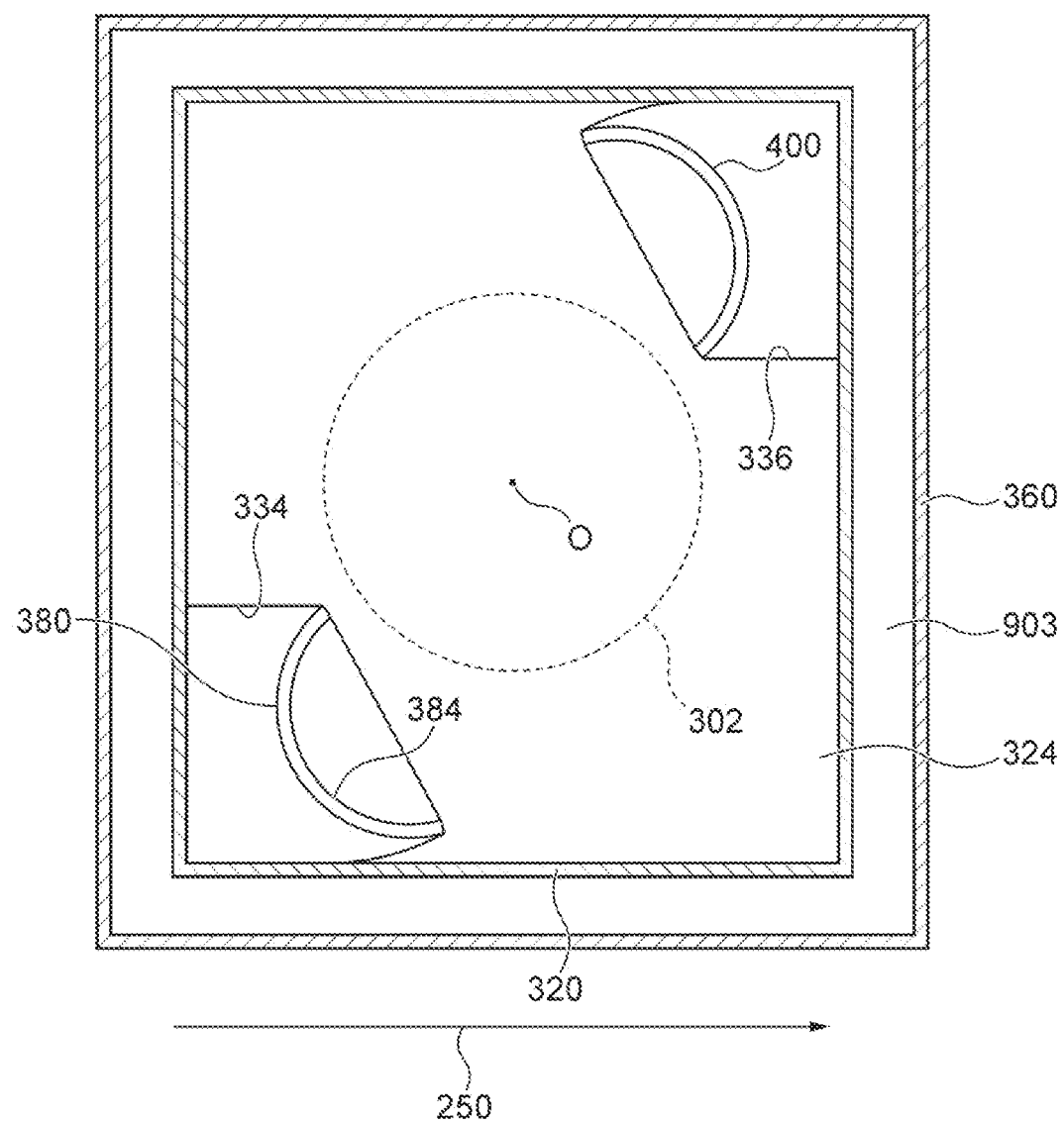
FIG. 3 is a sectional view along the line A-A of FIG. 2.
Figure 4:
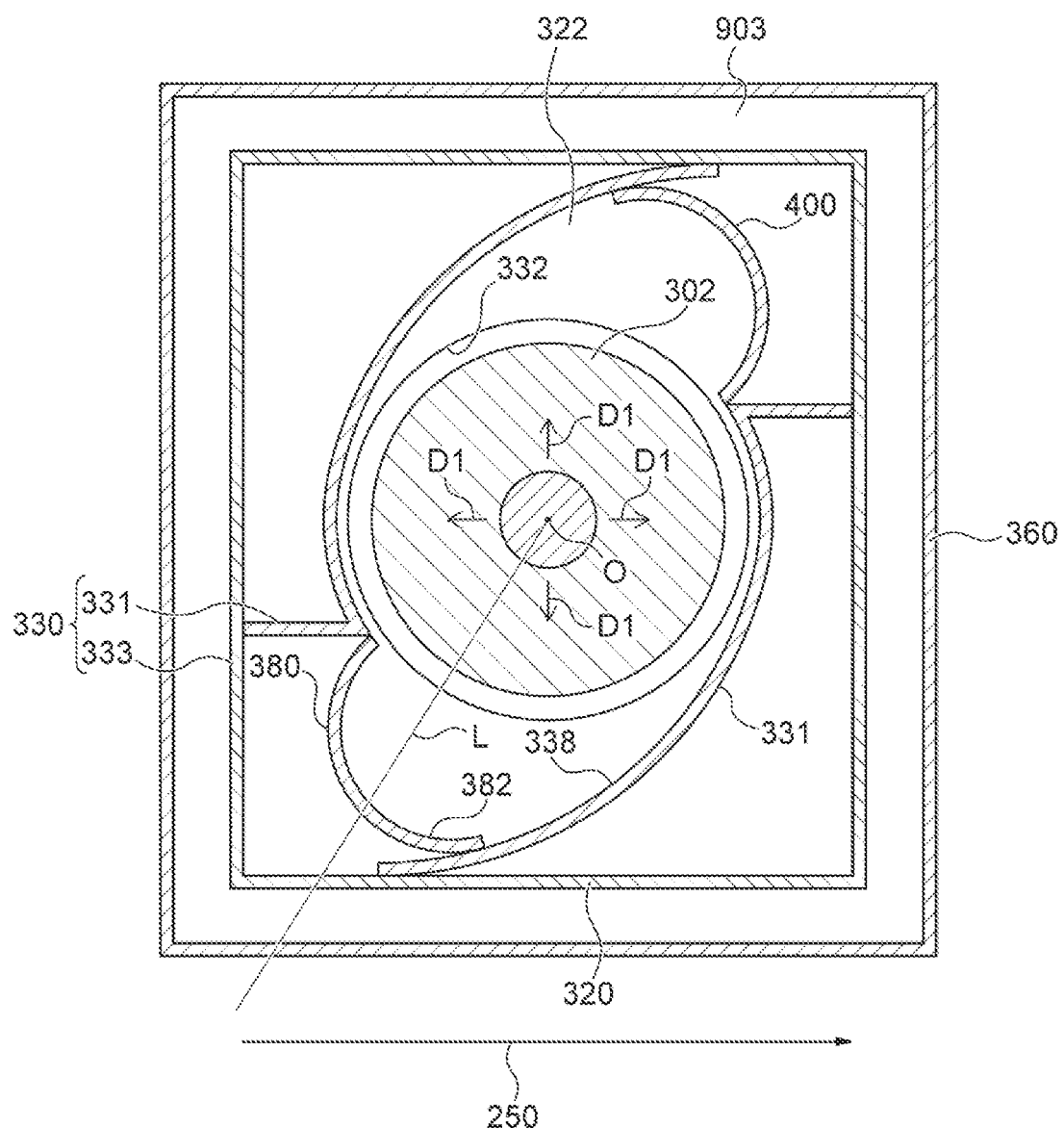
FIG. 4 is a sectional view along the line B-B of FIG. 2.

Next, description will be made as to the blowing units 300a, 300b and 300c with reference to FIG. 2. The blowing units 300a, 300b and 300c are different only in temperature of gas to be supplied, and have the same configuration. Consequently, FIG. 2 to FIG. 4 represent the blowing units 300a, 300b and 300c as the blowing unit 300 for description. FIG. 2 is a structural view of the blowing unit 300. FIG. 3 is a sectional view along the line A-A of FIG. 2, and FIG. 4 is a sectional view along the line B-B of FIG. 2. Note that in FIG. 2 to FIG. 4, an arrow 250 shows a conveying direction of the circuit board 200 in the reflowing furnace 100. That is, in the present embodiment, the circuit board 200 is conveyed in the direction indicated by the arrow 250. In the other embodiment, the circuit board 200 may be conveyed in a direction opposite to the direction indicated by the arrow 250.

Referring to FIG. 2, the blowing unit 300, as an example, includes a case 320, an external case 360, a first baffle plate 380, a second baffle plate 400, a plurality of nozzles 420, a fan 302, a motor 304, a rotary shaft 306, a plurality of heaters 308 and two punching metals 310. Hereinafter, respective constituent elements of the blowing unit 300 will be described.

The case 320 includes a first blowing chamber 322 and a second blowing chamber 324, and includes a case body 340 and a mounting plate 342. The case body 340 is a square tubular body having a substantially rectangular parallelepiped shape having an opening to be closed with the mounting plate 342. The case body 340 includes a first wall 326, a second wall 328 and an inner wall 330. Each of the first wall 326, the second wall 328 and the inner wall 330 is constituted of a plate-like member. The first wall 326 faces the fan 302 in an axial direction of the fan 302. More specifically, the first wall 326 is parallel to a plane vertical to the axial direction of the fan 302. The second wall 328 faces the first wall 326. More specifically, the second wall 328 is parallel to the first wall 326, and is located on a motor 304 side than the first wall 326. Then, the inner wall 330 connects the first wall 326 and the second wall 328. More specifically, the inner wall 330 is orthogonal to the first wall 326 and the second wall 328. Also, a part surrounded by the first wall 326, the second wall 328 and the inner wall 330 is the first blowing chamber 322. In other words, the first wall 326, the second wall 328 and the inner wall 330 define the first blowing chamber 322. Also, in the second wall 328, an intake port 332 is formed, and in the first wall 326, a first blowing port 334 and a second blowing port 336 are formed. In other words, the first blowing chamber 322 forms a flow path from the intake port 332 to the first blowing port 334, and a flow path from the intake port 332 to the second blowing port 336. Note that each of the first wall 326, the second wall 328 and the inner wall 330 may be constituted of a plate-like member, or may be a combination of a plurality of members.

The fan 302 is a turbofan as an example, and is housed in the first blowing chamber 322. Also, the fan 302 is connected to the motor 304 disposed outside the external case 360, via the rotary shaft 306. In other words, the rotary shaft 306 extends between the fan 302 and the motor 304 to pass through the intake port 332. Consequently, when the motor 304 is driven, the fan 302 can rotate and blow gas in a centrifugal direction D1. Also, the heaters 308 are housed in the external case 360, and heat gas to be taken inward by the fan 302 through the intake port 332. Consequently, the plurality of nozzles 420 described later can inject the heated gas. Note that the heaters 308 may be arranged at arbitrary positions of the blowing unit 300 as long as the heaters can heat gas to be injected by the plurality of nozzles 420. However, it is more preferable that the heaters 308 are arranged at positions adjacent to the rotary shaft 306, such as between the fan 302 and the motor 304. Consequently, the heaters 308 can heat the rotary shaft 306 at a higher temperature, and can inhibit flux from adhering to the rotary shaft 306. Note that in a case where the blowing unit 300 is used to cool the circuit board 200 as in the blowing unit 300c, the blowing unit 300 may include a known cooling unit 309 for cooling gas, such as a heat exchanger, in place of the heater 308.

Further, in the blowing unit 300, the first baffle plate 380 is a plate-like member, and includes a first edge 384 and a second edge 386 located on a side opposite to the first edge 384 (see FIG. 2). The first edge 384 is disposed in a region extending from the first blowing port 334 in the axial direction of the fan 302 (see FIG. 3). Also, the second edge 386 is disposed at a position via a space from, i.e., away from the second wall 328. Therefore, the first baffle plate 380 extends from the position via the space from the second wall 328 to a position in the first blowing port 334 in the axial direction of the fan 302 (see FIG. 2). Further, the first baffle plate 380 has a shape of a plate surface 382 expanding in a direction that intersects with a virtual line L extending radially from a rotation center O of the fan 302 (see FIG. 4). Consequently, the first baffle plate 380 is configured to blow gas through the first blowing port 334 at the uniform flow rate. A reason for this configuration will be described below while comparing with a blowing unit 500 that does not include the first baffle plate 380.

Figure 5:
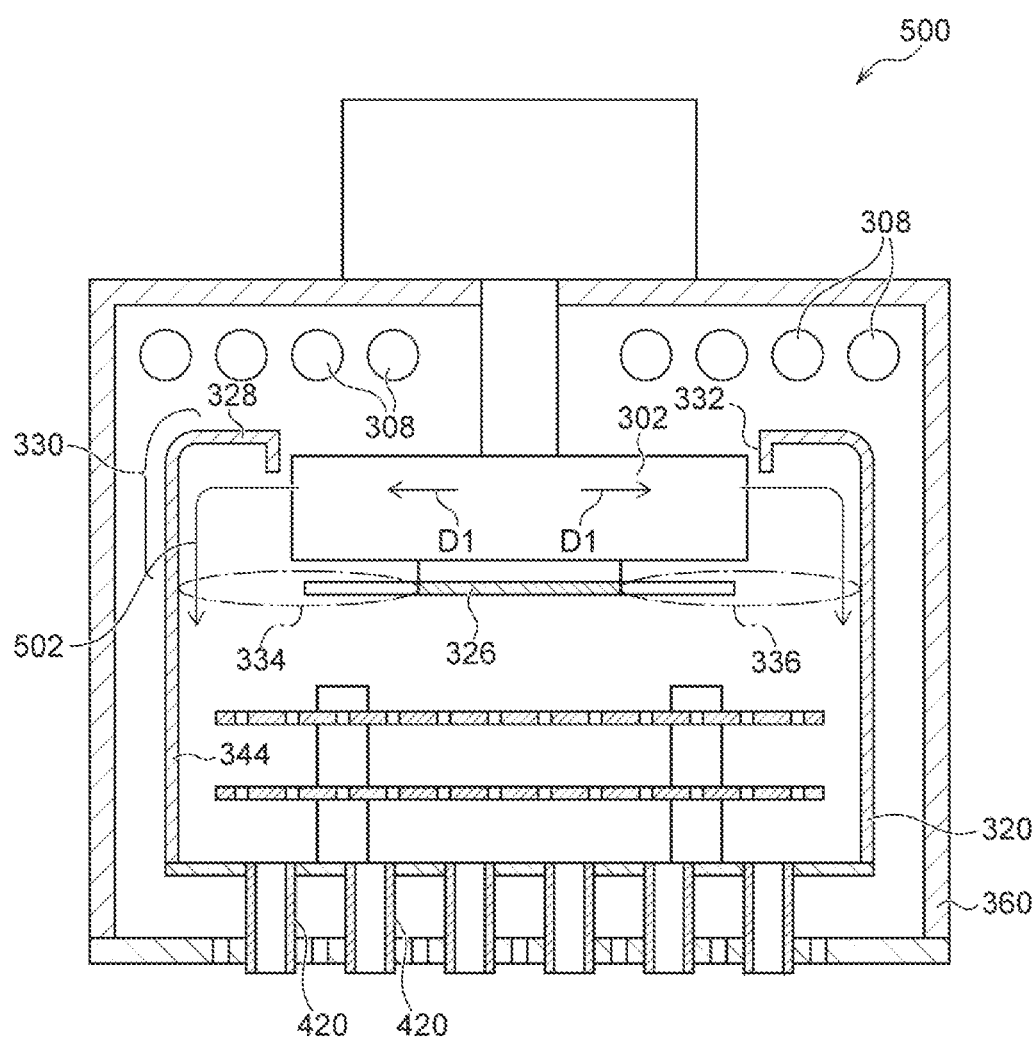
FIG. 5 is a structural view of a blowing unit that does not include a first baffle plate and a second baffle plate.

FIG. 5 is a structural view of the blowing unit 500 that does not include the first baffle plate 380. The blowing unit 500 has the same configuration as in the blowing unit 300, except that the unit does not include the first baffle plate 380 and the second baffle plate 400. In the blowing unit 500 that does not include the first baffle plate 380, gas blown from the fan 302 hits the inner wall 330, has a flowing direction changed, and is blown through the first blowing port 334. That is, most of the gas blown from the fan 302 flows as shown by an arrow 502 of FIG. 5. Consequently, for wind sent through the first blowing port 334, a flow rate of the blown gas is larger at a position close to the inner wall 330 than at a position far from the inner wall 330. As a result, gas is not blown through the first blowing port 334 at the uniform flow rate.

Next, see FIG. 2 again. In the blowing unit 300, part of the gas blown from the fan 302 passes between the second wall 328 and the second edge 386, hits the inner wall 330, and is blown through the position close to the inner wall 330 in the first blowing port 334. That is, part of the gas blown from the fan 302 flows as shown by an arrow 316 of FIG. 2. Also, the remaining part of the gas blown from the fan 302 hits the plate surface 382 of the first baffle plate 380. The gas that hits the plate surface 382 of the first baffle plate 380 has a flowing direction changed by the first baffle plate 380, and is blown through the position far from the inner wall 330 in the first blowing port 334. That is, part of the gas blown from the fan 302 flows as shown by an arrow 318 of FIG. 2. Consequently, the first baffle plate 380 can guide part of the gas blown from the fan 302 to a portion of the first blowing port 334 where the flow rate of the blown gas is low in the blowing unit 500 of FIG. 5. As a result, the blowing unit 300 can blow gas through the first blowing port 334 at a more uniform flow rate than in a case where the blowing unit does not include the first baffle plate 380.

Note that in the blowing unit 300, as described above, the first baffle plate 380 extends from the second edge 386 to the position in the first blowing port 334 in the axial direction of the fan 302, but does not have to extend to the first blowing port 334. Even in a case where the first baffle plate 380 does not extend to the first blowing port 334, the first baffle plate 380 can change the flowing direction of the gas that hits the plate surface 382. Consequently, the first baffle plate 380 can guide part of the gas blown from the fan 302 to the portion of the first blowing port 334 where the flow rate of the blown gas is low.

However, it is preferable that the first baffle plate 380 extends from the second edge 386 in the axial direction of the fan 302, in a direction away from the second wall 328, to a position reaching at least the first blowing port 334. In a case where the first baffle plate 380 does not extend to the position reaching the first blowing port 334, a space is generated between the first edge 384 of the first baffle plate 380 and the first wall 326 in the axial direction of the fan 302. Then, gas passing through this space toward the inner wall 330 collides with gas hitting the plate surface 382 of the first baffle plate 380 and flowing toward the first blowing port 334, and pressure loss might occur.

Also, referring to FIG. 2, in the blowing unit 300, the fan 302 extends from a proximal end 312 close to the motor 304 to a distal end 314 in the axial direction. Then, the second edge 386 of the first baffle plate 380 is located between the proximal end 312 and the distal end 314 in the axial direction of the fan 302.

A larger volume of the gas blown from the fan 302 flows between the proximal end 312 and the distal end 314 in the axial direction of the fan 302. Consequently, in a case where the second edge 386 of the first baffle plate 380 is not located between the proximal end 312 and the distal end 314, one of a flow rate of gas passing between the second wall 328 and the second edge 386 and a flow rate of the gas hitting the plate surface 382 of the first baffle plate 380 is much higher than the other flow rate. As a result, a difference between a flow rate of gas blown through the position close to the inner wall 330 in the first blowing port 334 and a flow rate of gas blown through the position far from the inner wall 330 in the first blowing port 334 is remarkably large, and gas might not be blown through the first blowing port 334 at the uniform flow rate.

On the other hand, in the blowing unit 300, the second edge 386 is located between the proximal end 312 and the distal end 314 in the axial direction. Consequently, the gas passing between the second wall 328 and the second edge 386 and the gas hitting the plate surface 382 of the first baffle plate 380 are uniformly distributed. As a result, the blowing unit 300 can blow gas through the first blowing port 334 at a more uniform flow rate.

Also, referring to FIG. 4, the first baffle plate 380 has a circular arc shape in a cross section parallel to the first wall 326. Then, the recessed plate surface 382 of the circular arc shape of the first baffle plate 380 is oriented in a direction to receive the gas blown from the fan 302. Consequently, the first baffle plate 380 can guide a larger volume of gas blown from the fan 302 to the first blowing port 334 than a first baffle plate having a linear shape. Hereinafter, a reason for such a configuration will be described. When gas collides with the plate surface 382 of the first baffle plate 380, the gas tries to flow to a space between the first baffle plate 380 and the second wall 328 and to the second blowing chamber 324, because a pressure of the space and chamber is lower than a pressure around the plate surface 382 (see FIG. 2).

First, a case where the first baffle plate 380 has the circular arc shape is considered. In the case where the first baffle plate 380 has the circular arc shape, as gas flows close to the first baffle plate 380, a width of a gas flow path formed by being surrounded by the plate surface 382 of the first baffle plate 380 gradually decreases (see FIG. 4). Then, the pressure of the gas gradually increases, and the gas tries to flow to the space with a lower pressure. Here, in the space between the first baffle plate 380 and the second wall 328, and the second blowing chamber 324, the second blowing chamber 324 that is downstream has a lower pressure. As a result, most of the gas colliding with the first baffle plate 380 flows to the second blowing chamber 324.

On the other hand, in a case where the first baffle plate 380 has the linear shape, when gas collides with the first baffle plate 380, the pressure around the plate surface 382 of the first baffle plate 380 rises at once. Consequently, the gas around the plate surface 382 tries to flow to the second blowing chamber 324. At this time, since the pressure around the plate surface 382 rises at once, the gas cannot sufficiently flow to the second blowing chamber 324. As a result, the gas that cannot flow to the second blowing chamber 324 flows through the space between the first baffle plate 380 and the second wall 328. Therefore, as described above, the first baffle plate 380 having the circular arc shape can guide a larger volume of gas blown from the fan 302 to the first blowing port 334 than the first baffle plate having the linear shape.

Also, the inner wall 330 includes a guide wall 331 and a wall 333. The guide wall 331 includes a curved portion 338 for guiding the gas blown from the fan 302 to the first baffle plate 380 (see FIG. 4). Then, the curved portion 338 has a circular arc shape in the cross section parallel to the first wall 326, and a recessed side of the circular arc shape faces toward the rotation center O of the fan 302. Consequently, the curved portion 338 having the circular arc shape guides the gas blown from the fan 302 to the first baffle plate 380, and hence, this gas can smoothly flow to the first baffle plate 380. As a result, pressure loss occurring from the fan 302 to the first baffle plate 380 can be reduced.

Further, in the blowing unit 300, the second baffle plate 400 is disposed in the first blowing chamber 322 to guide part of the gas blown from the fan 302 to the second blowing port 336 in the same manner as in the first baffle plate 380. Then, the second blowing port 336 is located on a side opposite to the first blowing port 334 via the rotation center O of the fan 302 (see FIG. 3). More specifically, the second baffle plate 400 is located at a point-symmetrical position to the first baffle plate 380 based on the rotation center O of the fan 302, and has the same shape as the first baffle plate 380. The second blowing port 336 is located at a point-symmetrical position to the first blowing port 334 based on the rotation center O of the fan 302, and has the same shape as the first blowing port 334. As a result, the blowing unit 300 can blow gas also through the second blowing port 336 at the uniform flow rate in the same manner as in the first blowing port 334.

Also, the case 320 includes the case body 340 and the mounting plate 342 as described above (see FIG. 2). Then, the case body 340 further includes an inner wall 344 constituted of a plate-like member. The mounting plate 342 is constituted of a plate-like member. The mounting plate 342 is configured to be attachable to the case body 340 in a state of being parallel to the first wall 326, and disposed on a side opposite to the fan 302 via the first wall 326. Further, the mounting plate 342 faces an after-mentioned plurality of suction ports 366 of a nozzle cover 364. Then, the inner wall 344 connects the first wall 326 and the mounting plate 342. More specifically, the inner wall 344 is orthogonal to the first wall 326 and the mounting plate 342. Also, the nozzles 420 are attached to the mounting plate 342. Each of the nozzles 420 includes a supply port 422 in the axial direction of the fan 302, and the nozzles are arranged in a vertical direction vertical to this axial direction. Also, a part surrounded by the first wall 326, the mounting plate 342 and the inner wall 344 is the second blowing chamber 324. In other words, the first wall 326, the mounting plate 342 and the inner wall 344 define the second blowing chamber 324. Consequently, when gas is blown through the first blowing port 334 or the second blowing port 336 at the uniform flow rate, this gas is supplied through the second blowing chamber 324 to the supply port 422 of each of the nozzles 420. As a result, the plurality of nozzles 420 can inject the gas through blowout ports 424, respectively, at the uniform flow rate.

Also, in the blowing unit 300, two punching metals 310 are arranged on a side opposite to the fan 302 via the first wall 326, and expand in parallel with the first wall 326. Consequently, the gas blown through the first blowing port 334 and the second blowing port 336 is further diffused by the punching metals 310, and the flow rate is more uniform at each position in the plane vertical to the axial direction of the fan 302. As a result, the blowing unit 300 can supply gas to the respective supply ports 422 of the plurality of nozzles 420 at a more uniform flow rate than the blowing unit that does not include the punching metals 310.

Further, in the blowing unit 300, the first blowing port 334 is formed in the first wall 326 so that a pressure at any position in the first blowing port 334 is higher than the pressure of the second blowing chamber 324. In a case where the pressure at one of the positions in the first blowing port 334 is lower than the pressure of the second blowing chamber 324, the gas blown to the second blowing chamber 324 passes through the position with the low pressure to return to the first blowing chamber 322, and the pressure loss occurs. However, in a case where the pressure at any position in the first blowing port 334 is higher than the pressure of the second blowing chamber 324, the gas blown to the second blowing chamber 324 does not return to the first blowing chamber 322 again, and the pressure loss due to the gas returning to the first blowing chamber 322 again does not occur.

Also, in the blowing unit 300, the external case 360 includes an external case body 362 and the nozzle cover 364 (see FIG. 2). Then, the external case body 362 is a box body having a substantially rectangular parallelepiped shape having an opening to be closed with the nozzle cover 364. The nozzle cover 364 can be fitted and connected to the external case body 362. Consequently, the external case body 362 and nozzle cover 364 integrally form the external case 360 having the substantially rectangular parallelepiped shape. Furthermore, the nozzles 420 extend through the nozzle cover 364 of the external case 360 to the outside of the external case 360. Then, in the nozzle cover 364 of the external case 360, the suction ports 366 through which external gas is suctioned inward are formed adjacent to the plurality of nozzles 420.

The blowing unit 300 includes the above described configuration, and hence, in the blowing unit 300, a flow path 906 extending from the plurality of suction ports 366 and passing through the heaters 308 and the fan 302 to reach the plurality of nozzles 420 is formed. Note that in the flow path 906, a flow path from the suction ports 366 to the intake port 332 is called a first flow path 903, a flow path from the intake port 332 to the first blowing port 334 or the second blowing port 336 is called a second flow path 904, and a flow path from the first blowing port 334 or the second blowing port 336 to the plurality of nozzles 420 is called a third flow path 905. Also, in the blowing unit 300, a part of the flow path 906 surrounds a peripheral end 347 of the mounting plate 342. That is, in the conveying direction of the circuit board 200, a part of the flow path 906 is located in front-rear and right-left directions of the peripheral end 347 of the mounting plate 342. In other words, a part of the flow path 906 is formed between the peripheral end 347 of the mounting plate 342 and the external case 360. Also, in the blowing unit 300, the first flow path 903 is located to surround the first blowing chamber 322 or the second blowing chamber 324 in a cross section parallel to the mounting plate 342 (see FIG. 2, FIG. 3 and FIG. 4). Consequently, in the blowing unit 300, gas suctioned through the suction ports 366 can pass along the first flow path 903 and around the peripheral end 347 of the mounting plate 342, pass through the first flow path 903 located to surround the case body 340, and flow to the intake port 332. Then, gas taken through the intake port 332 into the first blowing chamber 322 can pass along the second flow path 904 and through the first blowing chamber 322, and flow to the first blowing port 334 or the second blowing port 336. Afterward, gas blown through the first blowing port 334 or the second blowing port 336 to the second blowing chamber 324 can pass along the third flow path 905 and through the second blowing chamber 324, and flow to the plurality of nozzles 420.

Note that in another embodiment, a blowing path of the blowing unit 300 is not limited to the above described configuration, and an arbitrary configuration may be adopted. Specifically, the first flow path 903 may be located at any position in the blowing unit 300 as long as the path connects the suction ports 366 and the intake port 332. Furthermore, the third flow path 905 may be located at any position in the blowing unit 300 as long as the path connects the first blowing port 334 and the second blowing port 336 to the plurality of nozzles 420.

Also, in the reflowing furnace 100, the circuit board 200 is conveyed directly under the blowing units 300a, 300b and 300c (see FIG. 1). That is, the circuit board 200 is conveyed directly under the fan 302 of each of the blowing units 300a, 300b and 300c (see FIG. 2). Consequently, any large space for supplying gas is not required between the fan 302 and a conveying path of the circuit board 200 to be conveyed, in the reflowing furnace 100. That is, in the reflowing furnace 100, the fan 302 may be disposed close to the conveying path of the circuit board 200. In this case, a distance between the fan 302 and the conveying path of the circuit board 200 to be conveyed shortens. As a result, the blowing units 300a, 300b and 300c have a height decreased, and the reflowing furnace 100 is made small. That is, in the reflowing furnace 100, the conveying path of the circuit board 200 is located directly under the fan 302, and hence, the reflowing furnace 100 can be designed to be small.

(Operation)

Next, description will be made as to an operation of the blowing unit 300 in the reflowing furnace 100 with reference to FIG. 2. Upon turning on power of the blowing unit 300, the motor 304 is driven to start rotation of the fan 302. Then, a negative pressure is provided on an upstream side of the fan 302. As a result, gas inside the reflowing furnace 100 and outside the external case 360 is suctioned through the suction ports 366 into the external case 360 (see FIG. 1 and FIG. 2). Subsequently, this suctioned gas is heated with the heaters 308 inside the external case 360.

Next, this gas heated with the heaters 308 is suctioned through the intake port 332 into the case 320. Subsequently, the gas suctioned into the case 320 is blown from the fan 302 in the centrifugal direction D1. Afterward, part of the gas blown from the fan 302 passes between the second wall 328 and the second edge 386 of the first baffle plate 380, hits the inner wall 330, and is blown through a position close to the inner wall 330 in the first blowing port 334 to the second blowing chamber 324. Also, the remaining part of the gas blown from the fan 302 hits the plate surface 382 of the first baffle plate 380. Then, the gas that hits the plate surface 382 of the first baffle plate 380 has the flowing direction changed by the first baffle plate 380, and is blown through a position far from the inner wall 330 in the first blowing port 334 to the second blowing chamber 324. Consequently, gas is blown through each position in the first blowing port 334 at a more uniform flow rate than in a case where the first baffle plate 380 is not provided as described above. Further, the remaining gas blown from the fan 302 passes through the second blowing port 336 and is blown to the second blowing chamber 324 in the same manner as in the first blowing port 334. Next, the gas that passes through the first blowing port 334 or the second blowing port 336 is dispersed by two punching metals 310 and is supplied to the supply port 422 of each nozzle 420. Then, the gas is jetted through the blowout port 424 of the nozzle 420. Thus, the blowing unit 300 can supply hot air to the circuit board 200. As a result, the reflowing furnace 100 described above can perform soldering.

Supplements

A part or all of the above embodiment can be described in supplements as follows, and is not limited to the following supplements.

(Supplement 1)

A soldering apparatus according to Supplement 1 is a soldering apparatus that performs soldering, including a blowing unit that supplies gas to an object, wherein the blowing unit includes a case including a first blowing chamber, a fan housed in the first blowing chamber to blow the gas in a centrifugal direction, a first baffle plate, and a heater that heats the gas or a cooling unit that cools the gas, the case includes a first wall that faces the fan in an axial direction of the fan, a second wall that faces the first wall, and an inner wall connecting the first wall and the second wall, the first wall, the second wall and the inner wall define the first blowing chamber, in the first wall, a first blowing port is formed, and the first baffle plate is disposed in the first blowing chamber to guide part of the gas blown from the fan to the first blowing port.

In a case where the blowing unit does not include the first baffle plate, gas might not be blown through the first blowing port at a uniform flow rate. On the other hand, in the soldering apparatus according to Supplement 1, the first baffle plate can guide part of the gas blown from the fan to the first blowing port. Consequently, the first baffle plate can guide part of the gas blown from the fan to a portion of a first blowing port where a flow rate of blown gas is low in the blowing unit that does not include the first baffle plate. That is, this soldering apparatus can blow gas through the first blowing port at a more uniform flow rate than the soldering apparatus that does not include the first baffle plate.

(Supplement 2)

According to the soldering apparatus of Supplement 2, in the soldering apparatus described in Supplement 1, the first baffle plate includes a plate surface expanding in a direction that intersects with a virtual line extending radially from a rotation center of the fan, a first edge and a second edge located on a side opposite to the first edge, and extends from the second edge located at a position via a space from the second wall in the axial direction, in a direction away from the second wall, to reach at least the first blowing port, and the first edge is disposed in a region extending from the first blowing port in the axial direction.

In the case where the blowing unit does not include the first baffle plate, the gas blown from the fan hits the inner wall, has the flowing direction changed, and is blown through the first blowing port. Consequently, a flow rate of gas passing through a position close to an inner wall in the first blowing port is higher than a flow rate of gas passing through a position far from the inner wall, and the gas might not be blown through the first blowing port at the uniform flow rate. On the other hand, in the soldering apparatus according to Supplement 2, part of the gas blown from the fan passes between the second wall and the second edge, hits the inner wall, and is blown through the position close to the inner wall in the first blowing port. Further, the remaining part of the gas blown from the fan hits the plate surface of the first baffle plate. The gas that hits the plate surface of the first baffle plate has a flowing direction changed by the first baffle plate, and is blown through the position far from the inner wall in the first blowing port. Consequently, the first baffle plate can guide part of the gas blown from the fan to the portion of the first blowing port where the flow rate of the blown gas is low in the blowing unit that does not include the first baffle plate. That is, this soldering apparatus can blow gas through the first blowing port at a more uniform flow rate than in the case where the apparatus does not include the first baffle plate.

(Supplement 3)

According to the soldering apparatus of Supplement 3, in the soldering apparatus described in Supplement 2, the fan extends from a proximal end to a distal end in the axial direction, and the second edge is located between the proximal end and the distal end in the axial direction.

A larger volume of gas blown from the fan flows between the proximal end and the distal end in the axial direction. Consequently, in a case where the second edge is not located between the proximal end and the distal end, one of the flow rate of the gas passing between the second wall and the second edge and the flow rate of the gas hitting the plate surface of the first baffle plate is much higher than the other flow rate. As a result, a difference is made between the gas blown through the position close to the inner wall in the first blowing port and the gas blown through the position far from the inner wall in the first blowing port, and gas might not be blown through the first blowing port at the uniform flow rate. On the other hand, in the soldering apparatus according to Supplement 3, the second edge is located between the proximal end and the distal end in the axial direction. Consequently, gas passing between the second wall and the second edge and gas hitting the plate surface of the first baffle plate are uniformly distributed. As a result, this soldering apparatus can blow gas through the first blowing port at the uniform flow rate.

(Supplement 4)

According to the soldering apparatus of Supplement 4, in the soldering apparatus according to any one of Supplements 1 to 3, the first baffle plate has a circular arc shape in a cross section parallel to the first wall, and a recessed side of the circular arc shape of the first baffle plate is oriented in a direction to receive the gas blown from the fan.

According to the soldering apparatus of Supplement 4, the first baffle plate having the circular arc shape can guide a larger volume of gas blown from the fan to the first blowing port than a first baffle plate having a linear shape.

(Supplement 5)

According to the soldering apparatus of Supplement 5, in the soldering apparatus described in any one of Supplements 1 to 4, the inner wall includes a guide wall including a curved portion for guiding the gas blown from the fan to the first baffle plate, the curved portion has a circular arc shape in a cross section parallel to the first wall, and a recessed side of the circular arc shape faces toward a rotation center of the fan.

According to the soldering apparatus of Supplement 5, the curved portion having the circular arc shape guides the gas blown from the fan to the first baffle plate, and hence, this gas can smoothly flow to the first baffle plate. Consequently, in this soldering apparatus, pressure loss occurring from the fan to the first baffle plate can be reduced.

(Supplement 6)

According to the soldering apparatus of Supplement 6, in the soldering apparatus described in any one of Supplements 1 to 5, the blowing unit includes a second baffle plate, in the first wall, a second blowing port is formed, the second blowing port is located on a side opposite to the first blowing port via a rotation center of the fan, and the second baffle plate is disposed in the first blowing chamber to guide part of the gas blown from the fan to the second blowing port.

In the soldering apparatus according to Supplement 6, the second blowing port is formed on the side opposite to the first blowing port based on the rotation center of the fan, and gas can be blown through the second blowing port at the uniform flow rate in the same manner as in the first blowing port.

(Supplement 7)

According to the soldering apparatus of Supplement 7, in the soldering apparatus described in any one of Supplements 1 to 6, the blowing unit further includes a punching metal disposed on a side opposite to the fan via the first wall, and expanding in parallel with the first wall.

In the soldering apparatus according to Supplement 7, the gas blown through the first blowing port is further diffused by the punching metal, and the flow rate is uniform at each position in a plane vertical to the axial direction of the fan.

(Supplement 8)

According to the soldering apparatus of Supplement 8, in the soldering apparatus described in any one of Supplements 1 to 7, the blowing unit further includes a plurality of nozzles disposed on a side opposite to the fan via the first wall, each including a supply port through which the gas is supplied in the axial direction, and arranged in a vertical direction vertical to the axial direction.

In the soldering apparatus according to Supplement 8, gas is supplied to the respective supply ports of the plurality of nozzles at the uniform flow rate. Consequently, each of the plurality of nozzles can inject gas at the uniform flow rate.

(Supplement 9)

According to the soldering apparatus of Supplement 9, in the soldering apparatus described in Supplement 8, the case includes a second blowing chamber forming a flow path from the first blowing port to the supply port of each of the plurality of nozzles.

The soldering apparatus according to Supplement 9 can supply the gas blown through the first blowing port to the plurality of nozzles through the second blowing chamber.

(Supplement 10)

According to the soldering apparatus of Supplement 10, in the soldering apparatus described in Supplement 9, a pressure at any position in the first blowing port is higher than a pressure of the second blowing chamber.

According to the soldering apparatus of Supplement 10, since the pressure at any position in the first blowing port is higher than the pressure of the second blowing chamber, the gas blown to the second blowing chamber does not return to the first blowing chamber again. Consequently, pressure loss of the gas due to the gas returning to the first blowing chamber again does not occur.

(Supplement 11)

According to the soldering apparatus of Supplement 11, in the soldering apparatus described in Supplement 9 or 10, the blowing unit further includes an external case that houses the case, the plurality of nozzles extend through the external case to outside of the external case, the external case includes a suction port formed to suction external gas inward, and in the second wall, an intake port through which the fan takes gas outside the case inward is formed.

As above, the embodiment of the present invention and each modification according to the embodiment have been described, but the respective examples have been described above to facilitate understanding of the present invention, and needless to say, the present invention is not restricted. The present invention can be suitably changed or improved without departing from the scope, and equivalents are included in the present invention. Also, in a range where at least some of the above described problems can be solved, or a range where at least some of effects are produced, respective constituent elements described in claims and description can be arbitrarily combined or omitted.

REFERENCE SIGNS LIST

100: reflowing furnace
300 and 500: blowing unit
302: fan
308: heater
309: cooling unit
310: punching metal
320: case
322: first blowing chamber
324: second blowing chamber
326: first wall
328: second wall
330: inner wall
332: intake port
334: first blowing port
336: second blowing port
338: curved portion
360: external case
366: suction port
380: first baffle plate
382: plate surface
384: first edge
386: second edge
400: second baffle plate
420: nozzle
422: supply port
D1: centrifugal direction
L: virtual line
O: rotation center

What is claimed is:

1. A soldering apparatus that performs soldering, comprising
a blowing unit that supplies gas to an object, wherein
the blowing unit includes a case including a first blowing chamber, a fan housed in the first blowing chamber to blow the gas in a centrifugal direction, a first baffle plate, and a heater that heats the gas or a cooling unit that cools the gas,
the case includes a first wall that faces the fan in an axial direction of the fan, a second wall that faces the first wall, and an inner wall connecting the first wall and the second wall,
the first wall, the second wall and the inner wall define the first blowing chamber,
in the first wall, a first blowing port is formed,
the first baffle plate is disposed in the first blowing chamber to guide part of the gas blown from the fan out of the first blowing chamber in the axial direction through the first blowing port, and
the first baffle plate includes a first edge and a second edge located on a side opposite to the first edge, the second edge being spaced from the second wall on the axial direction within the first blowing chamber, and the first baffle plate being oriented to extend from the second edge in the axial direction and away from the second wall toward the first edge.

2. The soldering apparatus according to claim 1, wherein
the first baffle plate includes a plate surface expanding in a direction that intersects with a virtual line extending radially from a rotation center of the fan, and extends from the second edge in the axial direction, in the direction away from the second wall, to reach at least the first blowing port, and
the first edge is disposed in a region extending from the first blowing port in the axial direction.

3. The soldering apparatus according to claim 1, wherein
the fan extends from a proximal end to a distal end in the axial direction, and
the second edge is located between the proximal end and the distal end in the axial direction.

4. A soldering apparatus that performs soldering, comprising
a blowing unit that supplies gas to an object, wherein
the blowing unit includes a case including a first blowing chamber, a fan housed in the first blowing chamber to blow the gas in a centrifugal direction, a first baffle plate, and a heater that heats the gas or a cooling unit that cools the gas,
the case includes a first wall that faces the fan in an axial direction of the fan, a second wall that faces the first wall, and an inner wall connecting the first wall and the second wall,
the first wall, the second wall and the inner wall define the first blowing chamber,
in the first wall, a first blowing port is formed,
the first baffle plate is disposed in the first blowing chamber to guide part of the gas blown from the fan out of the first blowing chamber in the axial direction through the first blowing port,
the first baffle plate has a circular arc shape in a cross section parallel to the first wall, and
a concaved side of the circular arc shape of the first baffle plate is oriented in a direction to receive the gas blown from the fan.

5. A soldering apparatus that performs soldering, comprising
a blowing unit that supplies gas to an object, wherein
the blowing unit includes a case including a first blowing chamber, a fan housed in the first blowing chamber to blow the gas in a centrifugal direction, a first baffle plate, and a heater that heats the gas or a cooling unit that cools the gas,
the case includes a first wall that faces the fan in an axial direction of the fan, a second wall that faces the first wall, and an inner wall connecting the first wall and the second wall,
the first wall, the second wall and the inner wall define the first blowing chamber,
in the first wall, a first blowing port is formed,
the first baffle plate is disposed in the first blowing chamber to guide part of the gas blown from the fan out of the first blowing chamber in the axial direction through the first blowing port,
the inner wall includes a guide wall including a curved portion for guiding the gas blown from the fan to the first baffle plate, the curved portion has an arched shape in a cross section parallel to the first wall, and a concaved side of the arched shape faces toward a rotation center of the fan.

6. The soldering apparatus according to claim 1, wherein the blowing unit includes a second baffle plate, in the first wall, a second blowing port is formed, the second blowing port is located on a side opposite to the first blowing port via a rotation center of the fan, and the second baffle plate is disposed in the first blowing chamber to guide part of the gas blown from the fan to the second blowing port.

7. The soldering apparatus according to claim 1, wherein the blowing unit further includes a punching metal disposed on a side opposite to the fan via the first wall, and expanding in parallel with the first wall.

8. The soldering apparatus according to claim 1, wherein the blowing unit further includes a plurality of nozzles disposed on a side opposite to the fan via the first wall, each including a supply port through which the gas is supplied in the axial direction, and arranged in a vertical direction vertical to the axial direction.

9. A soldering apparatus that performs soldering, comprising a blowing unit that supplies gas to an object, wherein the blowing unit includes a case including a first blowing chamber, a fan housed in the first blowing chamber to blow the gas in a centrifugal direction, a first baffle plate, and a heater that heats the gas or a cooling unit that cools the gas, the case includes a first wall that faces the fan in an axial direction of the fan, a second wall that faces the first wall, and an inner wall connecting the first wall and the second wall, the first wall, the second wall and the inner wall define the first blowing chamber, in the first wall, a first blowing port is formed, the first baffle plate is disposed in the first blowing chamber to guide part of the gas blown from the fan out of the first blowing chamber in the axial direction through the first blowing port, the blowing unit further includes a plurality of nozzles disposed on a side opposite to the fan via the first wall, each including a supply port through which the gas is supplied in the axial direction, and arranged in a vertical direction vertical to the axial direction, and the case includes a second blowing chamber forming a flow path from the first blowing port to the supply port of each of the plurality of nozzles.

10. The soldering apparatus according to claim 9, wherein a pressure at any position in the first blowing port is higher than a pressure of the second blowing chamber.

11. The soldering apparatus according to claim 9, wherein the blowing unit further includes an external case that houses the case, the plurality of nozzles extend through the external case to outside of the external case, the external case includes a suction port formed to suction external gas inward, and an intake port is formed in the second wall, wherein the fan takes the gas inward through intake port from outside the case.

* * * * *